(12) United States Patent
Kwon

(10) Patent No.: US 12,550,749 B2
(45) Date of Patent: Feb. 10, 2026

(54) SEMICONDUCTOR PACKAGE

(71) Applicant: Samsung Electronics Co., Ltd., Suwon-si (KR)

(72) Inventor: Yonghwan Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 291 days.

(21) Appl. No.: 18/232,617

(22) Filed: Aug. 10, 2023

(65) Prior Publication Data

US 2024/0055362 A1 Feb. 15, 2024

(30) Foreign Application Priority Data

Aug. 11, 2022 (KR) .................. 10-2022-0100431

(51) Int. Cl.
*H01L 23/544* (2006.01)
*H01L 23/538* (2006.01)
(Continued)

(52) U.S. Cl.
CPC ........ *H01L 23/544* (2013.01); *H01L 23/5385* (2013.01); *H01L 23/5386* (2013.01); *H01L 25/105* (2013.01); *H01L 23/3128* (2013.01); *H01L 24/48* (2013.01); *H01L 2223/54426* (2013.01); *H01L 2224/48091* (2013.01); *H01L 2224/48105* (2013.01); *H01L 2224/48227* (2013.01); *H01L 2225/1035* (2013.01); *H01L 2225/1058* (2013.01)

(58) Field of Classification Search
CPC .................. H01L 23/544; H01L 2223/54426
See application file for complete search history.

(56) References Cited

U.S. PATENT DOCUMENTS 10,504,861 B2 12/2019 Moriyama et al.
11,114,407 B2 9/2021 Wang et al.
(Continued)

FOREIGN PATENT DOCUMENTS

CN 101964339 A 2/2011
CN 113629033 A 11/2021
(Continued)

*Primary Examiner* — Errol V Fernandes
(74) *Attorney, Agent, or Firm* — Muir Patent Law, PLLC

(57) ABSTRACT

A semiconductor package includes a redistribution structure including a first redistribution layer, a semiconductor chip on the redistribution structure and having a contact pad electrically connected to the first redistribution layer, a vertical connection conductor on the redistribution structure and electrically connected to the first redistribution layer, a molding portion disposed on the redistribution structure, a second redistribution layer disposed on the molding portion, connected to the vertical connection conductor, and having a plurality of first pads, each of the plurality of first pads having an alignment hole, a plurality of second pads respectively disposed on the plurality of first pads and having a side portion covering an inner sidewall of the alignment hole, the alignment hole having an inner space surrounded by the side portion, and a protective insulating layer covering the second redistribution layer, and having a plurality of contact openings respectively exposing the plurality of second pads.

20 Claims, 15 Drawing Sheets

(51) Int. Cl.
  *H01L 25/10* (2006.01)
  *H01L 23/00* (2006.01)
  *H01L 23/31* (2006.01)

(56) References Cited

U.S. PATENT DOCUMENTS

| | | |
|---|---|---|
| 11,164,839 B2 | 11/2021 | Chen et al. |
| 11,302,660 B2 | 4/2022 | Choi et al. |
| 2017/0084544 A1 | 3/2017 | Chen |
| 2017/0278802 A1 | 9/2017 | Chen et al. |
| 2020/0091086 A1 | 3/2020 | Huang et al. |
| 2020/0251374 A1* | 8/2020 | Makala ............. H01L 21/68742 |
| 2021/0028135 A1* | 1/2021 | Said ........................ H01L 24/80 |
| 2021/0183677 A1 | 6/2021 | Choi et al. |
| 2022/0059492 A1 | 2/2022 | Yoon et al. |
| 2022/0068829 A1* | 3/2022 | Park ...................... H01L 23/544 |

FOREIGN PATENT DOCUMENTS

| | | | |
|---|---|---|---|
| KR | 10-2015-0137969 A | 12/2015 | |
| KR | 10-2021-0077820 A | 6/2021 | |

\* cited by examiner

X-X'

X-X'

SEMICONDUCTOR PACKAGE

CROSS-REFERENCE TO RELATED APPLICATION(S)

This application claims benefit of priority under 35 U.S.C. § 119 to Korean Patent Application No. 10-2022-0100431 filed on Aug. 11, 2022 in the Korean Intellectual Property Office, the disclosure of which is incorporated herein by reference in its entirety.

BACKGROUND

The present disclosure relates to a semiconductor package.

A semiconductor package is an integrated circuit chip implemented in a form suitable for use in electronic products. The semiconductor package may have a pad structure for electrical/mechanical connection with an external device such as another semiconductor package, and may be connected to it using a bonding wire or a conductive bump (for example, a solder ball). A misalignment between a pad and an opening for the pad may degrade the reliability of the semiconductor package.

SUMMARY

An aspect of the present disclosure provides a semiconductor package having improved reliability.

According to an aspect of the present disclosure, there is provided a semiconductor package including a redistribution structure having a first surface and a second surface opposite each other, and including a first redistribution layer, a semiconductor chip disposed on the first surface of the redistribution structure and having a contact pad electrically connected to the first redistribution layer, a vertical connection conductor disposed around the semiconductor chip on the first surface of the redistribution structure and electrically connected to the first redistribution layer a molding portion disposed on the first surface of the redistribution structure and sealing the semiconductor chip and the vertical connection conductor, a second redistribution layer disposed on the molding portion, electrically connected to the vertical connection conductor, and having a plurality of first pads, each of the plurality of first pads having an alignment hole, a plurality of second pads respectively disposed on the plurality of first pads and having a side portion covering an inner sidewall of the alignment hole, the alignment hole having an inner space surrounded by the side portion, and the inner space being provided as an alignment mark, and a protective insulating layer disposed on the molding portion, covering the second redistribution layer, and having a plurality of contact openings respectively exposing regions of the plurality of second pads.

According to another aspect of the present disclosure, there is provided a semiconductor package including a redistribution structure having a first surface and a second surface, positioned to oppose each other, and including a first redistribution layer, a semiconductor chip disposed on the first surface of the redistribution structure and having a contact pad electrically connected to the first redistribution layer, a frame disposed on the first surface of the redistribution structure, having a cavity accommodating the semiconductor chip, and including a wiring structure electrically connected to the first redistribution layer, a molding portion disposed on the first surface of the redistribution structure and encapsulating the semiconductor chip, a second redistribution layer disposed on the molding portion, electrically connected to the wiring structure, and having a plurality of first pads, each of the plurality of first pads having an alignment hole, a plurality of second pads respectively disposed on the plurality of first pads and having a side portion covering an inner sidewall of the alignment hole, the alignment hole having an inner space surrounded by the side portion, and the inner space being provided as an alignment mark, and an opaque protective insulating layer disposed on the molding portion, covering the second redistribution layer, having a plurality of contact openings respectively exposing regions of the plurality of second pads, the plurality of contact openings exposing at least a portion of the alignment mark.

According to another aspect of the present disclosure, there is provided a semiconductor package including a first semiconductor package, and a second semiconductor package disposed on the first semiconductor package. The first semiconductor package may include a redistribution structure having a first surface and a second surface, positioned to oppose each other, and including a first redistribution layer, a first semiconductor chip disposed on the first surface of the redistribution structure and having a contact pad electrically connected to the first redistribution layer, a vertical connection conductor disposed around the first semiconductor chip on the first surface of the redistribution structure and electrically connected to the first redistribution layer, a molding portion disposed on the first surface of the redistribution structure and sealing the first semiconductor chip and the vertical connection conductor, a second redistribution layer disposed on the molding portion, electrically connected to the vertical connection conductor, and having a plurality of first pads, each of the plurality of first pads having an alignment hole, a plurality of second pads respectively disposed on the plurality of first pads and having a side portion covering an inner sidewall of the alignment hole, the alignment hole having an inner space surrounded by the side portion, and the inner space being provided as an alignment mark, and a protective insulating layer disposed on the molding portion, covering the second redistribution layer, and having a plurality of contact openings for respectively exposing regions of the plurality of second pads. The second semiconductor package may include a wiring board, a second semiconductor chip disposed on the wiring board, and a plurality of connection pads disposed on a lower surface of the wiring board and respectively electrically connected to regions of the plurality of second pads.

According to example embodiments of the present disclosure, an alignment state of a second pad and a contact opening may be measured using an alignment hole (or alignment mark) prepared in advance of a first pad, and a defect in a final pad (for example, exposure of the first pad) may be quickly and accurately determined using the measured value in a non-destructive manner.

The various and beneficial advantages and effects of example embodiments are not limited to the above description, and will be more easily understood in the course of describing specific example embodiments.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various example embodiments of the present disclosure will be described in detail with reference to the accompanying drawings.

Figure 1:
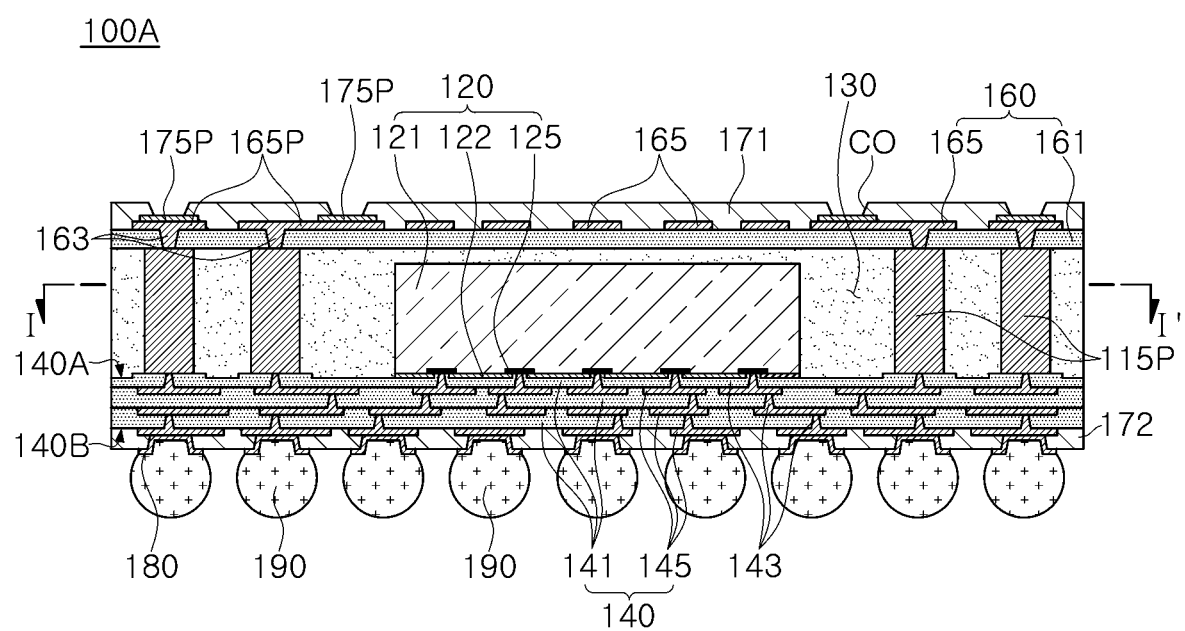
FIG. 1 is a side cross-sectional view illustrating a semiconductor package according to an example embodiment of the present disclosure.
Figure 2A:
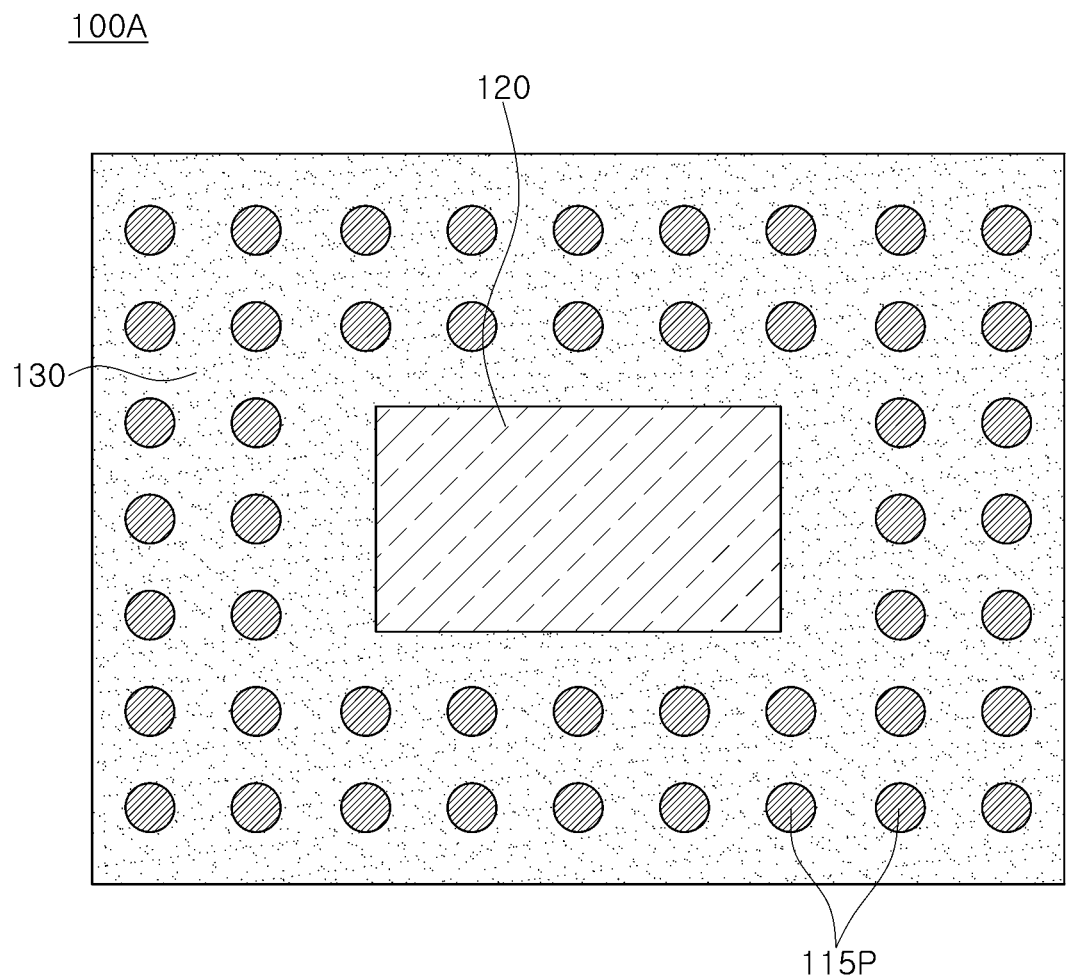
FIG. 2A is a plan view of the semiconductor package illustrated in FIG. 1 taken along line I-I'.

FIG. 1 is a side cross-sectional view illustrating a semiconductor package according to an example embodiment of the present disclosure. FIG. 2A is a plan view of the semiconductor package illustrated in FIG. 1 taken along line I-I', and FIG. 2B is a top plan view of the semiconductor package illustrated in FIG. 1.

Figure 2B:
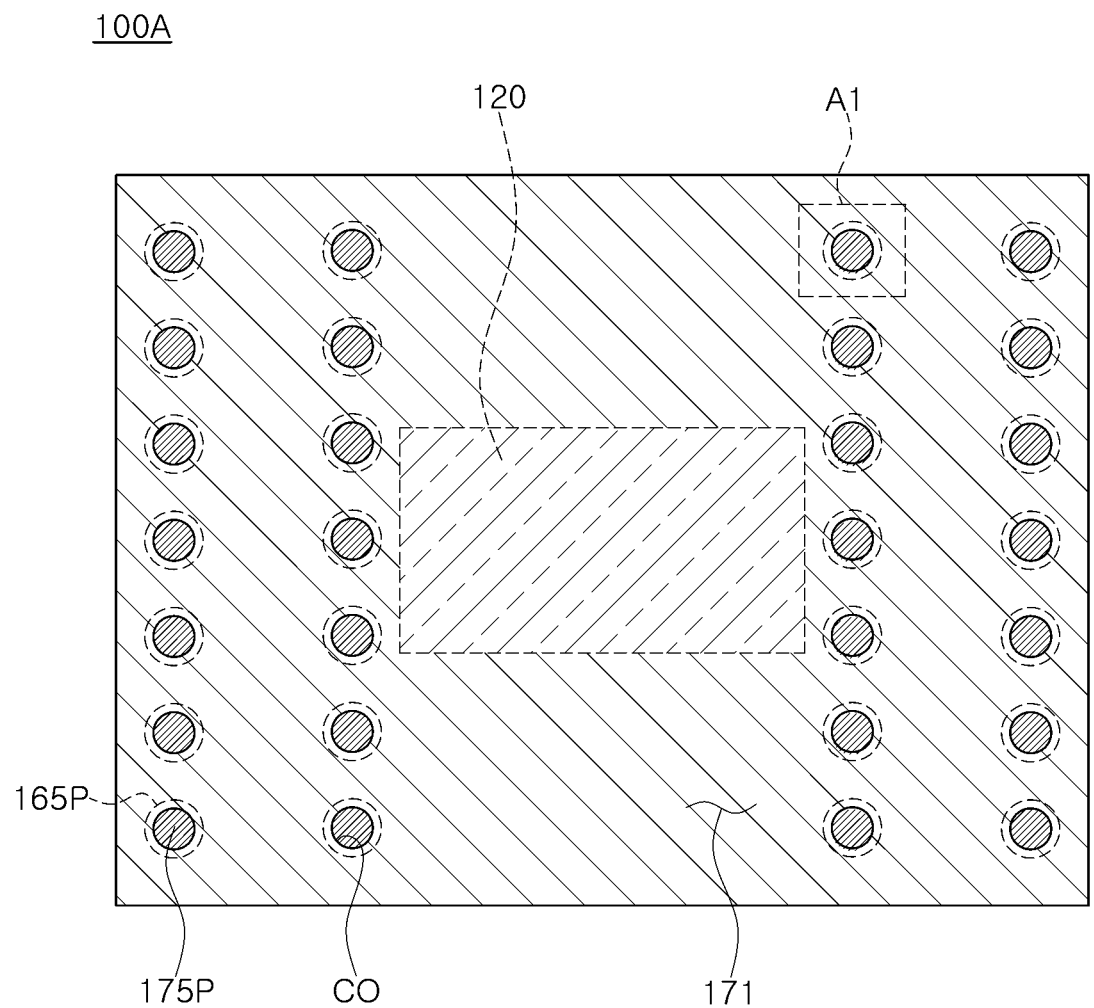
FIG. 2B is a top plan view of the semiconductor package illustrated in FIG. 1.

Referring to FIGS. 1 and 2A and 2B, a semiconductor package 100A according to the present example embodiment may include a first redistribution structure 140 having a first surface 140A and a second surface 140B positioned opposite to each other, a semiconductor chip 120 disposed on the first surface 140A of the first redistribution structure 140, a molding portion (e.g., a molding layer) 130 disposed on the first surface 140A of the first redistribution structure 140, the molding portion 130 encapsulating the semiconductor chip 120, and a second redistribution structure 160 disposed on the molding portion 130.

The first redistribution structure 140 may include a first redistribution layer 145 for redistributing contact pads 125 of the semiconductor chip 120. A UBM layer 180 and an external connection conductor 190 may be disposed on the second surface 140B of the redistribution structure 140, and may be physically and/or electrically connected to an external device (for example, a main board) through the external connection conductor 190.

As used herein, components described as being "electrically connected" are configured such that an electrical signal can be transferred from one component to the other (although such electrical signal may be attenuated in strength as it transferred and may be selectively transferred).

The first redistribution structure 140 may include an insulating member (e.g., an insulator) including a plurality of first insulating layers 141 and a plurality of first redistribution layers 145 wherein each first redistribution layer 145 is disposed on a corresponding one of the first insulating layers 141. The first redistribution layers 145 may include first redistribution vias 143 passing through the first insulating layers 141 and electrically connecting adjacent first redistribution layers 145 positioned on different levels. Uppermost first redistribution vias 143 may electrically connect the contact pads 125 of the semiconductor chip 120 and conductive posts 115P to an uppermost first redistribution layer 145.

The first redistribution structure 140 employed in the present example embodiment includes three first insulating layers 141, and three first redistribution layers 145 each having first redistribution vias 143. However, in another example embodiment, the first redistribution structure 140 may be implemented to include or be formed of one first insulating layer 141 and one first redistribution layer 145, or two or more first insulating layers 141 and two or more first redistribution layers 145.

The semiconductor package 100A according to the present example embodiment may include a plurality of conductive posts 115P disposed around the semiconductor chip 120 on the first surface 140A of the first redistribution structure 140. The conductive posts 115P may be electrically connected to (e.g., contact) the first redistribution layers 145, and may pass through the molding portion 130. For example, the conductive posts 115P may include or be formed of a metal such as copper (Cu), and may be formed by/using a plating process.

The second redistribution structure 160 may be disposed on an upper surface of the molding portion 130. The second redistribution structure 160 employed in the present example embodiment may include a second insulating layer 161 disposed on the molding portion 130 and a second redistribution layer 165 disposed on the second insulating layer 161. In the present example embodiment, an upper surface of a conductive post 115P may be exposed to the upper surface of the molding portion 130. The upper surface of the molding portion 130 may have a flat surface substantially coplanar with the upper surface of the conductive post 115P. The coplanar structure of the upper surface of the molding layer/portion 130 and the upper surface of the conductive post 115P may be formed by a planarization process. Such a planarization process may be performed using a grinding process on the molding portion 130 such that the upper surface of the conductive post 115P is exposed.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The second redistribution layer 165 may be electrically connected to the conductive post 115P through a second redistribution via 163 passing through the second insulating layer 161. Thus, the conductive post 115P may be provided as a vertical connection conductor electrically connecting the first redistribution layer 145 positioned at a lower part of the package and the second redistribution layer 165 positioned at an upper part of the package. In the present example embodiment, the conductive post 115P may pass through the molding portion 130 sealing/encapsulating the semiconductor chip 120, and may electrically connect the first redistribution layer 145 and the second redistribution layer 165 to each other. In some example embodiments, the second redistribution structure 160 may be formed after the grinding process on the molding portion 130, and may be formed as a multilayered redistribution structure in a similar manner to or the same way as the first redistribution structure 140. In another example embodiment (for example, see FIG. 10), the molding portion 130 may be formed to cover the conductive post 115P. The second redistribution layer 165 may be directly formed on the molding portion 130 without the second insulating layer 161, and the second redistribution via 163 may pass through a partial region (e.g., a portion) of the molding layer/portion 130 to be electrically connected to (e.g., contact) an upper surface of the vertical connection conductor (for example, see 112c). For example, the vertical connection conductor may be a conductor or a set of conductor patterns electrically connecting the first redistribution structure 140 and the second redistribution structure 160 in a vertical direction.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Similarly, "directly formed on an element" indicates that there are no intervening elements present on the element.

A protective insulating layer 171 may be formed on the second insulating layer 161 to cover the second redistribution layer 165. The protective insulating layer 171 may have a contact opening CO through which a pad structure may be electrically connected to (e.g., contact) the second redistribution layer 165. A region exposed by the contact opening CO may be provided as a pad region for electrically connecting the second redistribution layer 165 to an external device (for example, an upper semiconductor package for a POP structure).

The protective insulating layer 171 may be introduced to protect the second redistribution structure 160 from external physical and chemical damage. For example, the protective insulating layer 171 may include or be formed of an insulating material such as prepreg, an Ajinomoto build-up film (ABF), FR-4, bismaleimide triazine (BT), a solder resist, or PID. The protective insulating layer 171 employed in the present example embodiment may include or be formed of an opaque insulating layer such as an opaque solder resist.

Figure 3A:
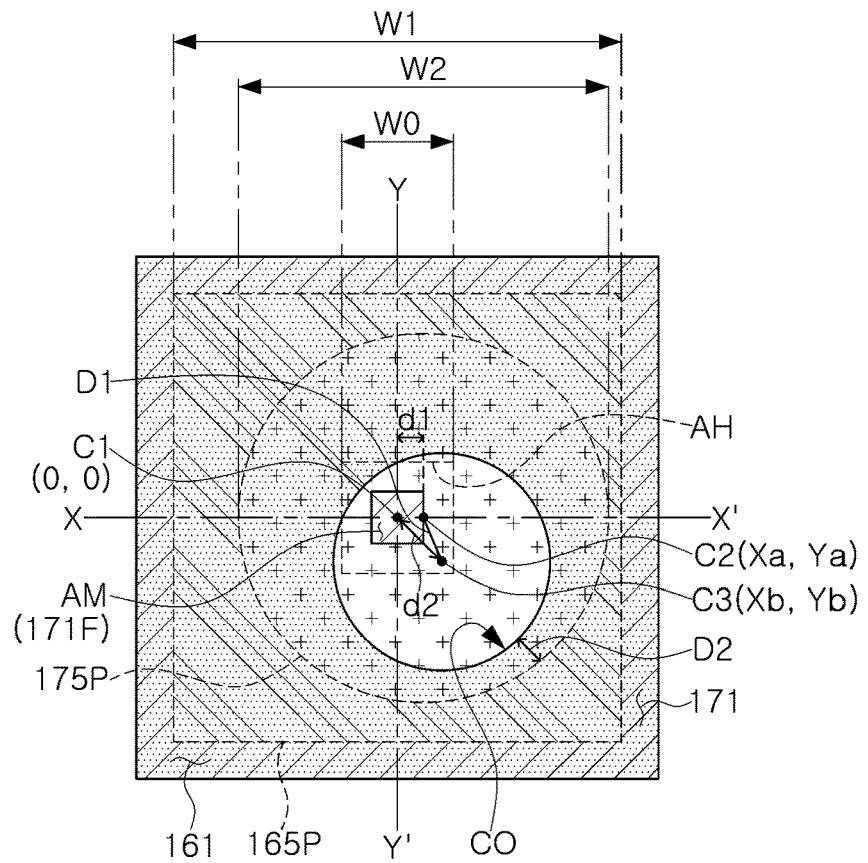
FIG. 3A is a partially enlarged view illustrating a portion "A1" of the semiconductor package illustrated in FIG. 2B.
Figure 3B:
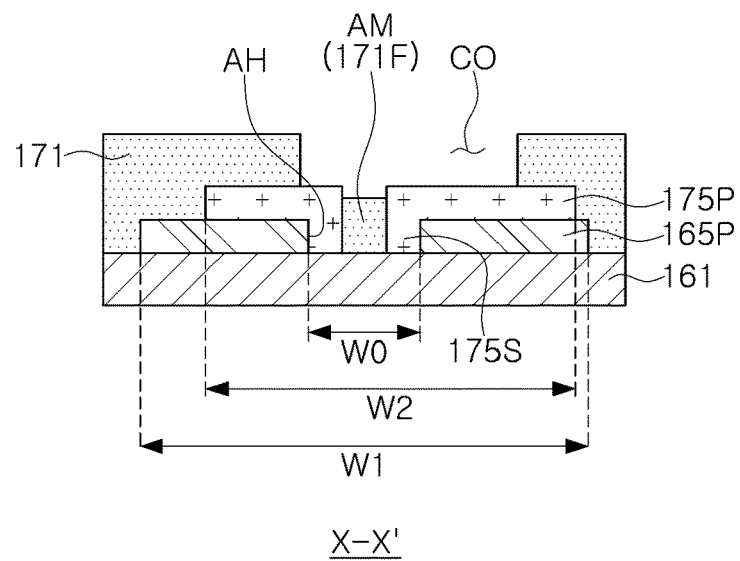
FIG. 3B is a side cross-sectional view of the portion "A1" of FIG. 3A taken along line X-X'.

FIGS. 3A and 3B are respectively a plan view and a side cross-sectional view of a pad structure employed in the present example embodiment. For example, FIG. 3A is a partially enlarged view illustrating a portion "A1" of the semiconductor package illustrated in FIG. 2B, and FIG. 3B is a side cross-sectional view of the portion "A1" of FIG. 3A taken along line X-X'.

Referring to FIGS. 3A and 3B, a pad structure employed in the present example embodiment may include a first pad 165P provided as a partial region (e.g., a portion) of the second redistribution layer 165 and a second pad 175P disposed on the first pad 165P. As described above, a partial region (e.g., a portion) of the second pad 175P may be exposed through the contact opening CO formed in the protective insulating layer 171, and may be provided as a pad region for an electrical connection to an external device. The first pad 165P may be formed of a material the same as that of the second redistribution layer 165. The first pad 165P may be formed by/using a plating process the same as that of the second redistribution layer 165. For example, the first pad 165P may include or be formed of a metal, e.g., copper (Cu). The second pad 175P, a metal layer different from that of the first pad 165P, may include a metal more stabilized than the metal of the first pad 165P, and may include or be formed of two or more layers. For example, the second pad 175P may include or be formed of Ni/Au.

The first pad 165P may have an alignment hole AH. As illustrated in FIG. 3A, the alignment hole AH may be positioned in a central portion C1 (coordinate (0,0)) of the first pad 165P. A central portion of the alignment hole AH and a central portion of the first pad 175P may substantially correspond to each other. For example, the first pad 175P may overlap the alignment hole AH, e.g., in a vertical direction. For example, the first pad 175 may surround and enclose the alignment hole AH in a plan view. The alignment hole AH may be used as a mark (also referred to as an "alignment mark") serving as an overlay reference for checking an alignment state.

In the present example embodiment, each of the first pad 165P and the alignment hole AH may have a rectangular shape, but is not limited thereto, and may have a circular shape or another polygonal shape. In some example embodiments, the first pad 165P and the alignment hole AH may have different shapes. As illustrated in FIG. 3B, the alignment hole AH may be formed to expose a portion of the second insulating layer 161. However, the present disclosure is not limited thereto, and when the second redistribution structure 160 includes only the second redistribution layer 165 without the second insulating layer 161, a partial region (e.g., a portion) of the molding portion 130 may be exposed through the alignment hole AH (see FIG. 10).

In the present example embodiment, second pads 175P may be respectively disposed on first pads 165P. The second pad 175P may be positioned in an upper surface region of the first pad 165P. For example, the second pad 175P may contact an upper surface of the first pad 165P. The second pad 175P may have a width W2 narrower than a width W1 of the first pad 165P. For example, the second pad 175P may be disposed within outer boundaries (e.g., inside four sides of the rectangular shape of the first pad 165P. The second pad 175P may have a circular shape unlike the shape of the first pad 165P, but may have different shapes in some example embodiments.

The second pad 175P may have a side portion 175S covering an inner sidewall of the alignment hole AH. The side portion 175S of the second pad 175P may cover/contact an inner sidewall of the first pad 165P exposed by the alignment hole AH. The alignment hole AH may have an inner space surrounded by the side portion 175S, and the inner space may be provided as an alignment mark AM. For example, the alignment mark AM may be formed with an empty space of the inner space surrounded by the side portion 175S of the second pad 175P or may be formed with a material layer (e.g., the same material as the one forming the protective insulating layer 171) filling the inner space surrounded by the side portion 175S of the second pad 175P. The inner space of the alignment hole AH may need to remain after the second pad 175P is formed, such that the alignment hole AH may have a width Wo greater than twice a thickness of the second pad 175P. In addition, although not limited thereto, the alignment hole AH may have a width of 50% or less of the width W1 of the first pad 165P. In some example embodiments, the alignment mark AM may have a width having a range of 10 μm to 50 μm.

A central portion C2 (coordinate (Xa,Ya)) of the second pad 175P may be ideally aligned to overlap a central portion C1 of the first pad 165P in a vertical direction. However, a deviation/misalignment indicated by "d1" may occur due to a process deviation/error (e.g., as a normal manufacturing process), as illustrated in FIGS. 3A and 3B. A deviation d1 between the central portion C1 of the first pad 165P and the central portion C2 of the second pad 175P may be easily measured using the visually identifiable alignment hole AH. The deviation d1 does not necessarily mean that the semiconductor package and/or the corresponding process is out of specification. For example, the deviation d1 may be in a range of acceptable deviation. In certain cases, when the deviation d1 is out of the range of the acceptable deviation, the semiconductor package and/or the corresponding process may be considered to be out of specification.

In the present example embodiment, the alignment mark AM may include a filled material portion 171F positioned in the inner space. The filled material portion 171F may be a material the same as that of the protective insulating layer 171, for example, may be an opaque insulating material. The filled material portion 171F may be formed by a remaining portion of the protective insulation layer 171 filled in the alignment hole AH when the contact opening CO is formed by removing a portion of the protective insulation layer 171. The remaining filling portion 171F may be provided with a visually identifiable alignment mark AM. An upper surface of the alignment mark AM may be defined depending on a height of the charging portion 171F. In some example embodiments, the alignment mark AM may have an upper surface having a level equal to or lower than that of an upper surface of the second pad 175P.

The contact opening CO may be formed such that only the second pad 175P is exposed. The contact opening CO may open at least a portion of the alignment mark AM. An alignment state of the contact opening CO may be measured using the alignment mark AM exposed by the contact opening CO (see FIG. 4). A central portion (e.g., a center point) C3 (coordinate (Xb,Yb)) of the contact opening CO may be ideally aligned to overlap the central portion (e.g., a center point) C1 of the first pad 165P in a vertical direction. However, a misalignment/deviation indicated by "d2" may occur due to a process deviation/error, as illustrated in FIGS. 3A and 3B. A deviation d2 between the central portion C1 of the first pad 165P and the central portion C2 of the second pad 175P may be easily measured using the visually identifiable alignment mark AM. The deviation d2 does not necessarily mean that the package and/or the corresponding process is out of specification. For example, the deviation d2 may be in a range of acceptable deviation. In certain cases, when the deviation d2 is over the acceptable deviation, the semiconductor package and/or the corresponding process may be considered to be out of specification.

Thus, in processes of forming the second pad 175P and the contact opening CO, the above-described deviation/misalignments may occur. As illustrated in FIGS. 3A and 3B, at least one of the second pads 175P may have the central portion C2 deviating from the central portion C1 of the alignment hole AH. Similarly, at least one of the contact openings CO may have the central portion C3 deviating from the central portion C1 of the alignment hole AH or the alignment mark AM.

When the first pad 165P, not the second pad 175P, is exposed by the contact opening CO using the alignment hole AH and/or the alignment mark AM, a final pad may be determined as having a defect. Such a misalignment state (or overlay) may be accurately determined in a non-destructive manner in a final pad structure using the widths W1 and W2 of the first and second pads 165P and 175P and the above-described central portion deviations d1 and d2. Such an overlay measurement method will be described in detail with reference to FIGS. 5A to 8B together with FIG. 4.

The semiconductor package 100A according to the present example embodiment may further include a passivation layer 172, an under bump metallurgy (UBM) layer 180, and an external connection conductor 190.

The passivation layer 172 may be introduced to protect the first redistribution structure 140 from external physical and chemical damage. For example, the passivation layer 172 may include or be formed of an insulating material such as prepreg, an ABF, FR-4, a BT solder resist, or PID.

The UBM layer 180 may be arranged on the second surface 140B of the first redistribution structure 140. For example, the UBM layer 180 may be formed to be connected to (e.g., contact) a region of a redistribution layer exposed by an opening of a lowermost first insulating layer 141 and/or the passivation layer 172 of the first redistribution structure 140 (in particular, a lowermost first redistribution layer). The UBM layer 180 may be formed by/using a known metallization method using a known conductive material, e.g., a metal.

Stress transferred through the external connection conductor 190 such as a solder ball on a board level (e.g., in a state in which the semiconductor package 100A is mounted on the main board) may be dispersed. The external connection conductor 190 may be disposed on the UBM layer 180, and may be used to physically and/or electrically connect the semiconductor package 100A to an external device such as a main board. For example, the external connection conductor 190 may include or be formed of a solder such as a low-melting-point metal, for example, tin (Sn)-aluminum (Al)-copper (Cu). The external connection conductor 190 may be a multilayer conductor or a single layer conductor. For example, the multilayer conductor may include or be formed of a copper pillar and a solder, and the single layer conductor may include or may be a tin-silver solder or copper. The number of electrical connection conductor 190, an interval between the electrical connection conductor 190, and an arrangement of the electrical connection conductor 190, are not particularly limited, and in fact, there may be hundreds to thousands or more variations.

Hereinafter, main components of the semiconductor package 100A according to the present example embodiment will be described in more detail.

As described above, the first redistribution structure 140 employed in the present example embodiment may include a plurality of first insulating layers 141 and a plurality of redistribution layers 145 respectively disposed on the plurality of first insulating layers 141. For example, the first insulating layers 141 may be formed of a photosensitive insulating material such as a photosensitive insulating (PID) resin. When the first insulating layers 141 are formed of a photosensitive material, a fine pitch of the first redistribution vias 143 may be more easily implemented using a photolithography process. In some example embodiments, the first insulating layers 141 may include or be formed of a thermosetting resin such as an epoxy resin, or a thermoplastic resin such as polyimide.

For example, the first redistribution layers 145 may include or be formed of copper (Cu), aluminum (Al), silver (Ag), tin (Sn), gold (Au), nickel (Ni), lead (Pb), or titanium (Ti), or an alloy thereof. The first redistribution layers 145 may include a signal pattern and a power pattern. In some example embodiments, the first redistribution layers 145 may include additional patterns having various functions. For example, the first redistribution layers 145 may include a ground pattern in addition to the signal pattern and the power pattern. For example, each of the first redistribution layers 145 may include a ground pattern, a signal pattern and a power pattern. On the same level, the first redistribution vias 143 may be formed together with the redistribution layer 145 using the same plating process. For example, a first redistribution layer 145 and corresponding first redistribution vias 143 may be formed together by the same plating process. For example, the first redistribution layer 145 and one or more first redistribution vias 143 may be integrally formed as one body without boundaries between the first redistribution layer 145 and the one or more first redistribution vias 143. Each of the first redistribution vias 143 may have a tapered structure determined according to a formation direction. In the present example embodiment, the first redistribution via 143 may have a width decreasing in a direction approaching the first surface 140A. The second redistribution structure 160 employed in the present example embodiment may also be formed in a similar manner to or the same way as the first redistribution structure 140.

The semiconductor chip 120 may include a semiconductor body 121 having an active surface on which various circuit devices are formed, and a passivation layer 122 protecting contact pads 125 electrically connected to the circuit devices, and an active surface. The semiconductor body 121 may include, for example, silicon (Si), germanium (Ge), or gallium arsenide (GaAs). The contact pads 125, elements for electrically connecting the semiconductor chip 120 to another component (the redistribution layer 145), may include or be formed of, for example, aluminum (Al) or copper (Cu). A passivation film 122 may include or be formed of an oxide film and/or a nitride film.

The semiconductor chip 120 may be a processor chip. For example, the semiconductor chip 120 may include or may be a microprocessor, a graphic processor, a signal processor, a network processor, a chipset, an audio codec, a video codec, an application processor, or a system on chip (ASIC), an application-specific IC (ASIC), or a power management IC (PMIC), but the present disclosure is not limited thereto. For example, the microprocessor may include or may be a single core or a multicore. In some example embodiments, the semiconductor chip 120 may be a volatile memory chip or a non-volatile memory chip. For example, the volatile memory chip may include or may be dynamic random access memory (DRAM), static RAM (SRAM), thyristor RAM (TRAM), zero capacitor RAM (ZRAM), or twin transistor RAM (TTRAM). The non-volatile memory chip may include or may be, for example, a flash memory, a magnetic RAM (MRAM), a spin-transfer torque MRAM (STT-MRAM), a ferroelectric RAM (FRAM), a phase change RAM (PRAM), a resistive RAM (RRAM), nanotube RRAM, polymer RAM, nano floating gate memory, holographic memory, molecular electronics memory, or insulator resistance change memory.

The molding portion 130 may protect a frame 110 (shown in FIG. 10) and the semiconductor chip 120. The molding portion 130 may include or be formed of, for example, a thermosetting resin such as an epoxy resin, or a thermoplastic resin such as polyimide. In some example embodiments, the molding portion 130 may be formed of an epoxy molding compound (EMC).

Figure 4:
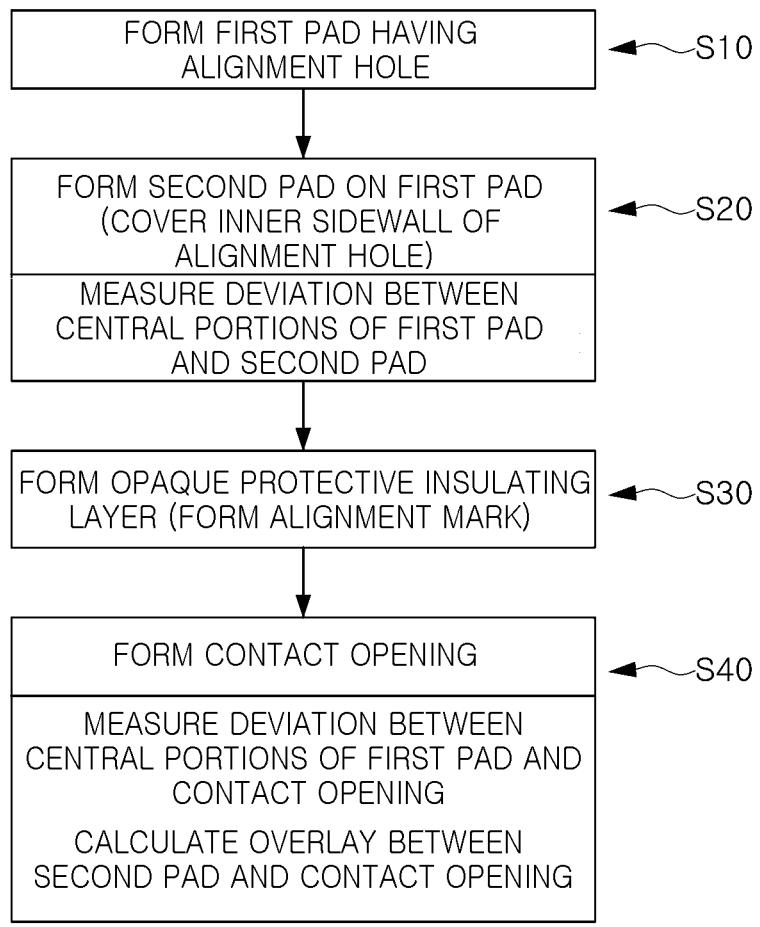
FIG. 4 is a flowchart illustrating a method of a forming a pad and a process of measuring an overlay according to an example embodiment of the present disclosure.

FIG. 4 is a flowchart illustrating a method of a forming a pad and a process of measuring an overlay (e.g., an overlay alignment) according to an example embodiment of the present disclosure. FIGS. 5A, 6A, 7A and 8A are plan views of main processes illustrating a method of forming a pad according to an example embodiment of the present disclosure, and FIGS. 5B, 6B, 7B and 8B are cross-sectional side views of the planes of FIGS. 5A, 6A, 7A and 8A taken along line X-X'.

Figure 5A:
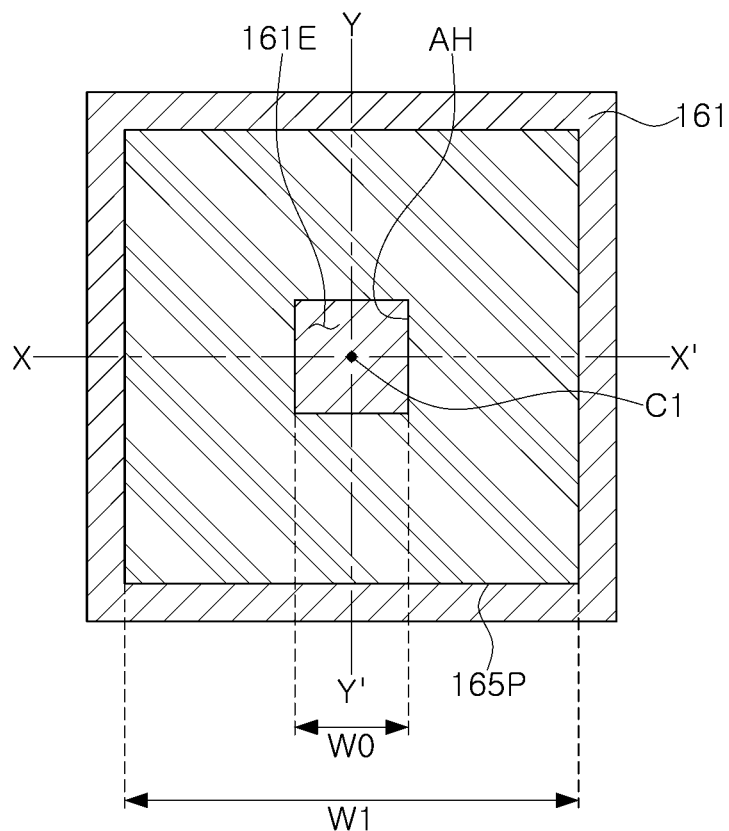
FIGS. 5A, 6A, 7A and 8A are plan views illustrating main processes of a method of forming a pad according to an example embodiment of the present disclosure, respectively.
Figure 5B:
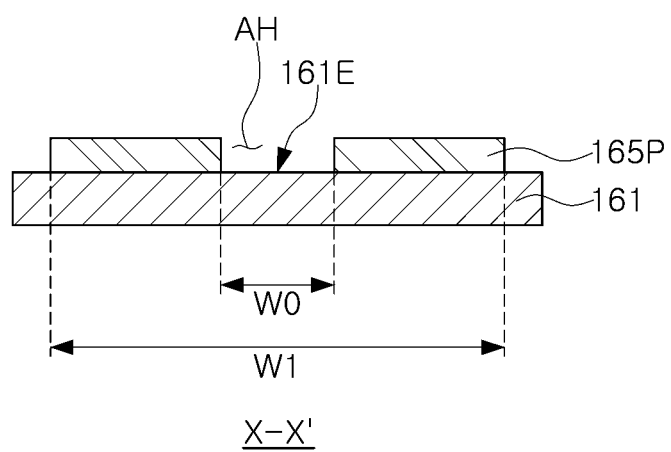
FIGS. 5B, 6B, 7B and 8B are side cross-sectional views of planes of FIGS. 5A, 6A, 7A and 8A taken along line X-X', respectively.

Referring to FIGS. 5A and 5B together with FIG. 4, the method of forming a pad structure employed in the present example embodiment may start with an operation/step of forming the first pad 165P having the alignment hole AH (S10).

In the present example embodiment, the first pad 165P may be formed by/using a plating process the same as that of the second redistribution layer 165. For example, after the second insulating layer 161 is formed on the molding portion 130, a via hole may be formed in a region of the second insulating layer 161 corresponding to a second redistribution via (163 in FIG. 1). Subsequently, a seed layer may be formed on the second insulating layer 161, and the second redistribution layer 165 and the first pad 165P may be formed in a desired region by a plating process using a photoresist pattern. In this case, the alignment hole AH may be formed by forming a non-plated region within the first pad 165P using the photoresist pattern covering the non-plated region.

The alignment hole AH may be formed to be positioned in the central portion C1 of the first pad 165P. A central portion of the alignment hole AH may be positioned on the central portion C1 of the first pad 165P. The alignment hole AH may be used as an overlay measurement standard for checking an alignment state. The alignment hole AH may expose a partial region (e.g., a portion) of the second insulating layer 161 or a partial region (e.g., a portion) of the molding layer/portion 130, e.g., when the second insulating layer 161 is not formed on the molding layer 130. For example, a width Wo of the alignment hole AH may be 50% or less of the width W1 of the first pad 165P. In some example embodiments, the width Wo of the alignment hole AH may be 30% or less of the width W1 of the first pad 165P.

Figure 6A:
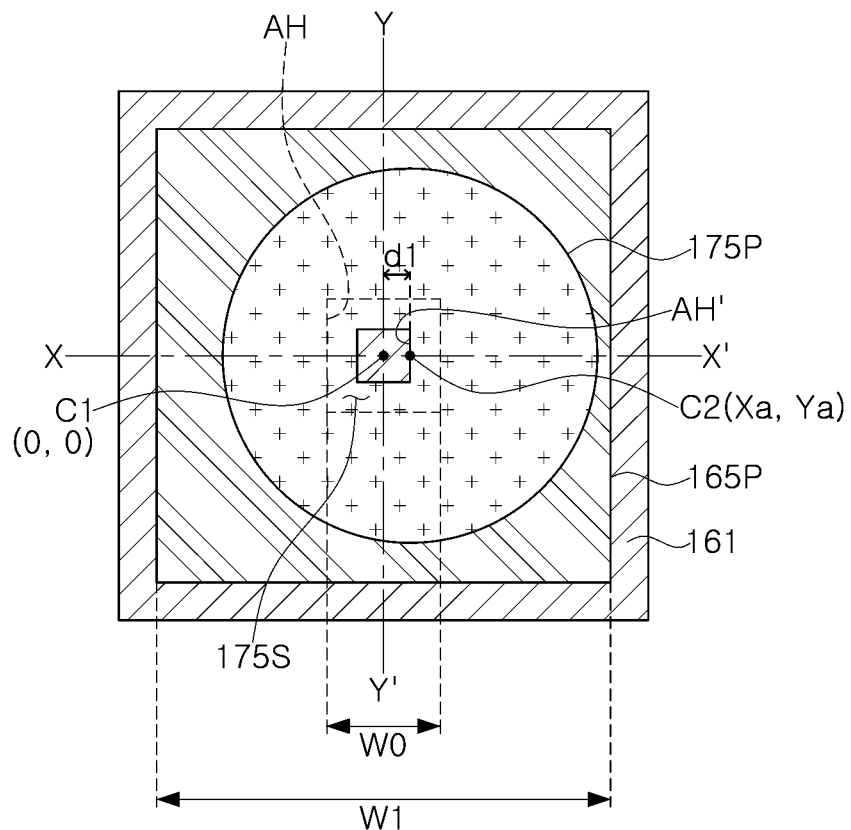
Figure 6B:
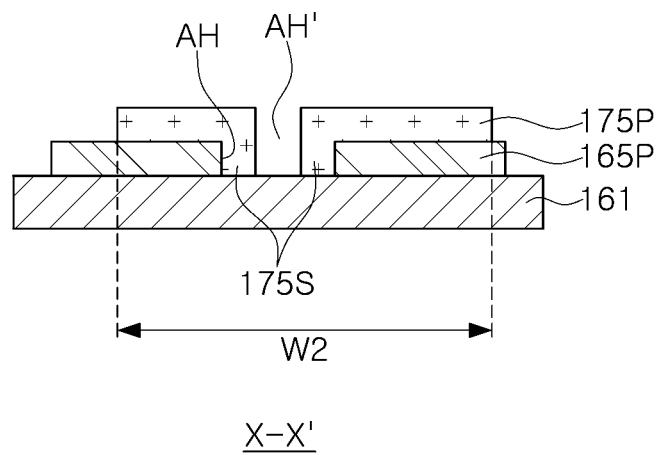

Subsequently, referring to FIGS. 6A and 6B together with FIG. 4, the second pad 175P may be formed on the first pad 165P (S20).

The second pad 175P may have the width W2 narrower than the width W1 of the first pad 165P such that the second pad 175P is positioned within an upper surface region of the first pad 165P. For example, outer boundaries of the second pad 175P may be positioned within outer boundaries of the first pad 165P in a plan view. The second pad 175P may be formed by/using a plating process. The second pad 175P may be formed using a plating process slightly different from the plating process for the first pad. For example, a photoresist pattern for the second pad 175P may be formed without a seed layer, and a plating lead-in line (not illustrated) electrically connected to the first pad 165P and the second redistribution layer 165 may be used to form the second pad 175P on the first pad 165P.

In such a plating process, the second pad 175P may be formed using the first pad 165P as a seed layer, such that a plating layer for the second pad 175P may be formed not only on an upper surface of the first pad 165P but also on an inner sidewall of the first pad 165P exposed to the alignment hole AH. A portion of the plating layer formed on the inner sidewall of the first pad 165P may be referred to as a side portion 175S of the second pad 175P. The side portion 175S may prevent the first pad 165P from being exposed due to the alignment hole AH even in a final pad structure. For example, the side portion 175S may cover and contact side surfaces of the first pad 165P exposed to the alignment hole AH.

The alignment hole AH may have a sufficient width Wo such that the alignment hole AH is not completely buried by the side portion 175S. For example, the width Wo of the alignment hole AH may be at least twice a thickness t of the second pad 175P. For example, even after the second pad 175P is formed, the alignment hole AH may have an inner space AH' surrounded by the side portion 175S of the second pad 175P. A portion of the second insulating layer 161 may still be exposed by the inner space AH', and the exposed portion may be visually identified, e.g., by a microscope, and thus may be used as an alignment mark even on a level of the inner space AH'. For example, the inner space AH' may be used as an alignment mark with or without a layer formed in the inner space AH'.

The central portion C2 of the second pad 175P may be ideally formed to overlap the central portion C1 of the first pad 165P in a vertical direction. However, as illustrated in FIGS. 6A and 6B, a deviation/misalignment indicated by "d1" may occur due to a process deviation/error. In the present operation, a deviation d1 between the central portion C1 of the first pad 165P and the central portion C2 of the second pad 175P may be easily measured using the visually identifiable alignment hole AH.

The second pad 175P may have a metal layer different from that of the first pad 165P. For example, the second pad 175P may include or be formed of a metal more stabilized than a metal included in or forming the first pad 165P. For example, the first pad 165P may include or be formed of copper (Cu), and the second pad 175P may include or be formed of Ni/Au.

Figure 7A:
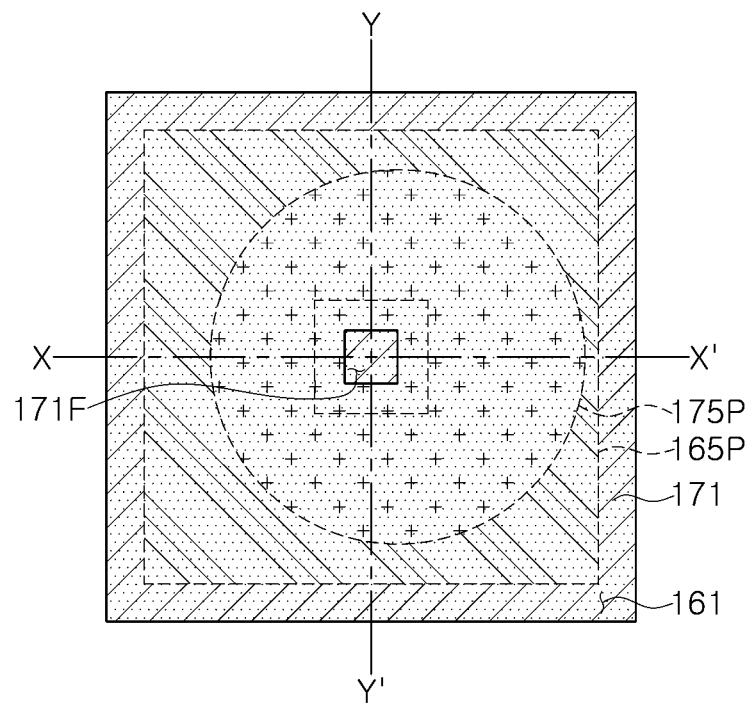
Figure 7B:
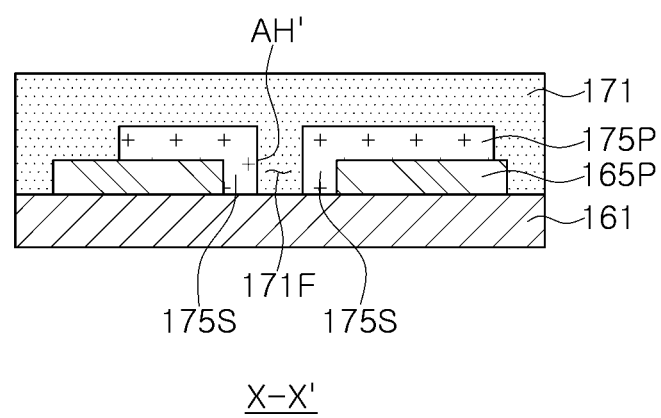

Subsequently, referring to FIGS. 7A and 7B together with FIG. 4, the protective insulating layer 171 may be formed on the second insulating layer 161 (S30).

The protective insulating layer 171 may be formed to cover the second redistribution layer 165, the first pad 165P, and the second pad 175P. The protective insulating layer 171 may include or be formed of an opaque insulating material. The protective insulating layer 171 may also have a filled portion 171F in the remaining inner space AH' of the alignment hole AH. The filled portion 171F of the protective insulating layer 171 may remain after forming a contact opening (e.g., "CO" in FIG. 8A) to be provided as the alignment mark AM. For example, the filled portion 171F of the protective insulating layer 171 may form the alignment mark AM.

Figure 8A:
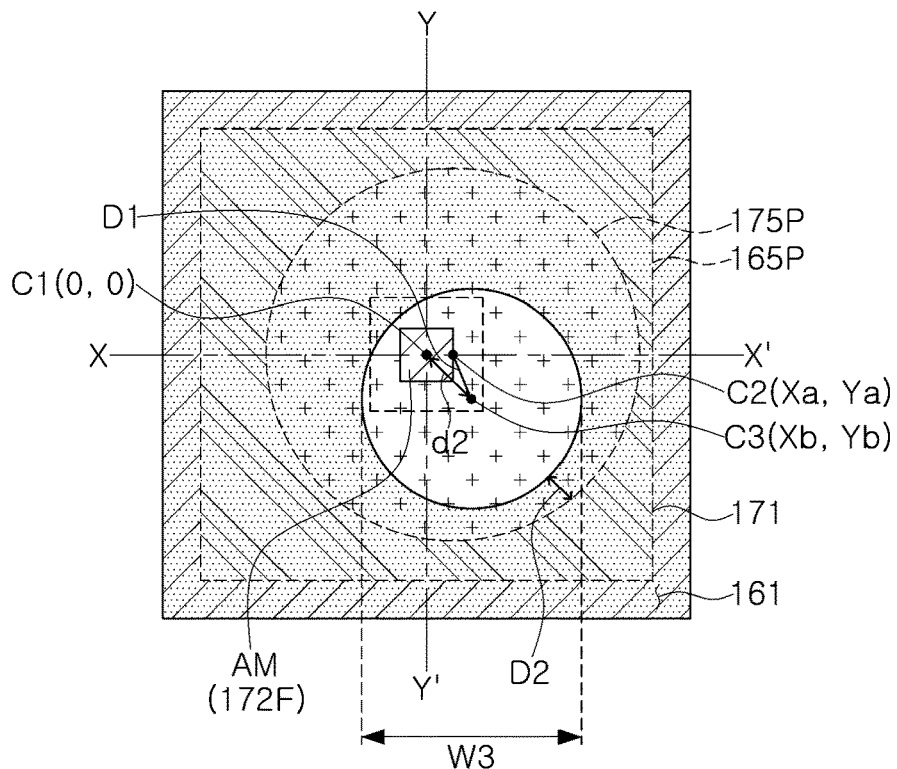
Figure 8B:
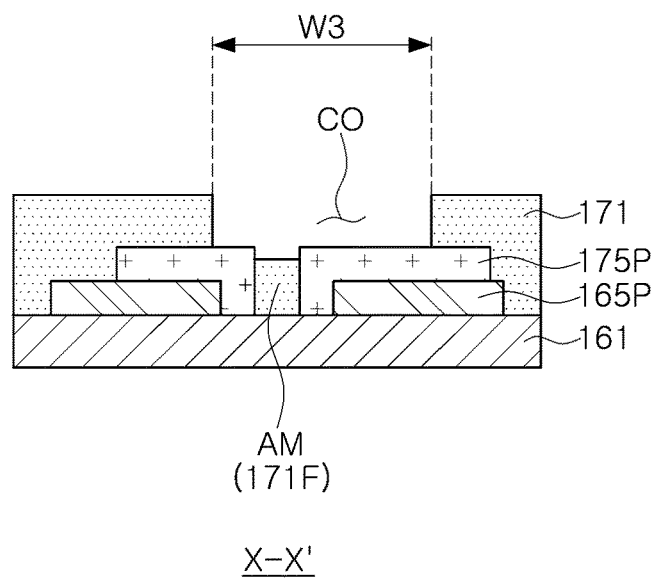

Subsequently, referring to FIGS. 8A and 8B together with FIG. 4, the contact opening CO exposing a partial region (e.g., a portion) of the second pad 175P may be formed in the protective insulating layer 171 (S40).

A process of forming the contact opening CO may be performed by partially removing the protective insulating layer 171 such that a region of the second pad 175P is exposed using a laser. After the contact opening is formed, the filled material portion 171F may remain in the inner space AH' of the alignment hole AH, and the remaining filled material portion 171F may be provided as the alignment mark AM. A level of an upper surface of the alignment mark AM defined by a height of the remaining portion may be equal to or lower than that of an upper surface of the second pad 175P. For example, as illustrated in FIG. 8B, the filled material portion 171F may be partially filled in the inner space AH'.

The contact opening CO may be formed to expose only the second pad 175P without exposing a portion of the first pad 165P. For example, the first pad 165P may be fully covered by the second pad 175P and the protective insulating layer 171, e.g., after forming the contact opening CO. The contact opening CO may be formed to have an appropriate width W3. However, in the present process, it may be difficult to visually identify a region for the contact opening CO due to the opaque protective insulating layer 171. Thus, even when another alignment key prepared in advance is used, a misalignment/deviation may occur due to a process deviation/error. Therefore, after the contact opening CO is formed, an alignment state of the contact opening CO may need to be accurately measured in a non-destructive manner to check whether the alignment state of the contact opening CO is acceptable or not.

In general, the central portion (e.g., the center point) C3 of the contact opening CO may be ideally formed to overlap the central portion (e.g., the center point) C1 of the first pad 165P in a vertical direction. However, in addition to an error/deviation "d1" of the previous process, a misalignment/deviation indicated by "d2" may occur due to a process deviation/error. The deviation d2 between the central portion (e.g., the center point) C3 of the contact opening CO and the central portion (e.g., the center point) C1 of the first pad 165P may be easily measured using the visually identifiable alignment mark AM.

In such series of processes, evaluation of a misalignment state in a final pad structure, e.g., a method of calculating an overlay (e.g., an overlay alignment) may be performed as follows.

First, a deviation D1 between a central portion (e.g., a center point) C2 of the second pad 175P and a central portion (e.g., a center point) C3 of the contact opening CO may be calculated using the previously measured values through Equation (1) below.

$$D1=\sqrt{(Xa-Xb)^2+(Ya-Yb)^2} \tag{1}$$

Subsequently, a deviation between an edge of the second pad 175P and an edge of the contact opening OC, e.g., an overlay D2, may be calculated through Equation (2) below using the deviation D1 obtained above.

$$D2=(W1-W3)/2-D1 \tag{2}$$

When the overlay D2 is less than 0, it may be determined as an alignment defect in which the first pad 165P is exposed through the contact opening CO.

Thus, a defect in which the first pad 165P, not the second pad 175P, is exposed by the contact opening CO may be determined in a non-destructive manner through a simple measurement and calculation process using the alignment hole AH and/or the alignment mark AM.

Figure 9:
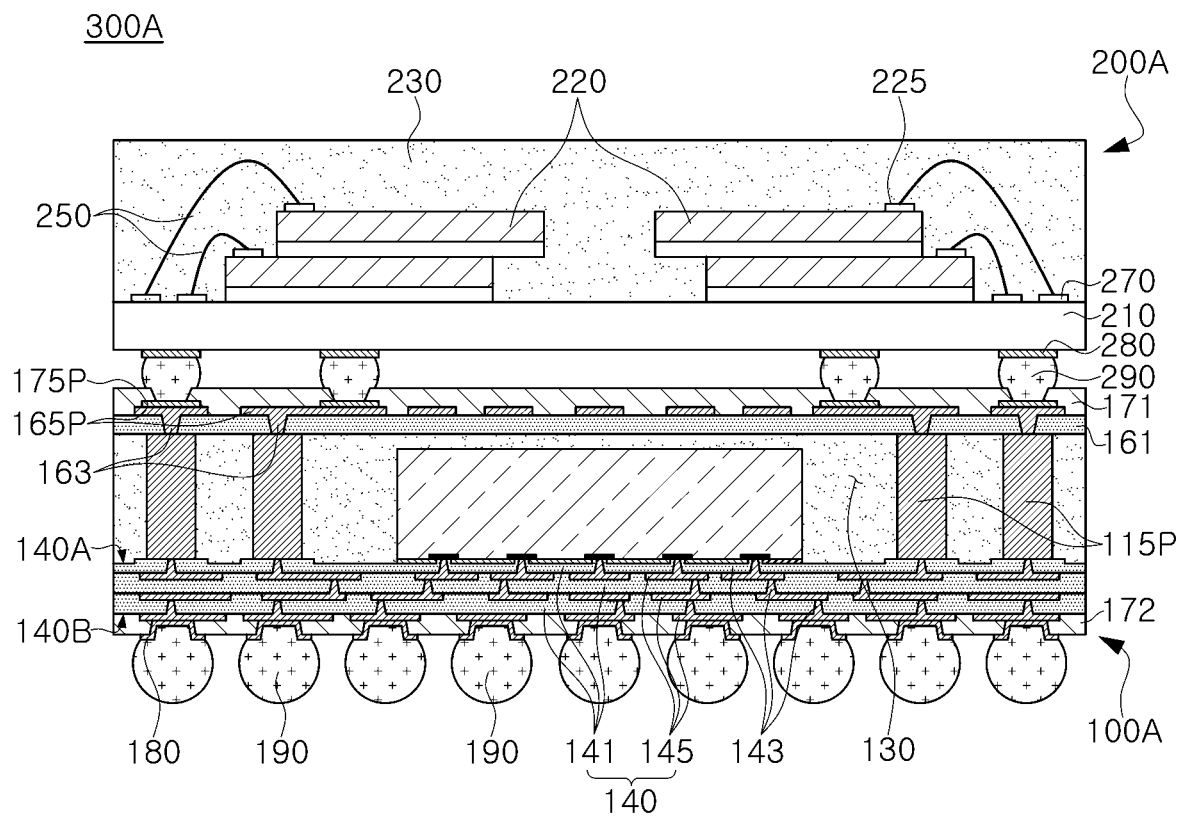
FIG. 9 is a side cross-sectional view illustrating a package on package (POP)-type semiconductor package employing the semiconductor package illustrated in FIG. 1.

FIG. 9 is a side cross-sectional view illustrating a package on package (POP)-type semiconductor package employing the semiconductor package illustrated in FIG. 1.

Referring to FIG. 9, a semiconductor package 300A according to the present example embodiment may include a first semiconductor package 100A and a second semiconductor package 200A. The semiconductor package 300A according to the present example embodiment may be a POP-type semiconductor package in which the second semiconductor package 200A is stacked on the first semiconductor package 100A.

The first semiconductor package 100A may be the semiconductor package described with reference to FIGS. 1, 2A, and 2B. The first semiconductor package 100A may have a pad structure having an alignment mark. The alignment mark may be formed in the first pad 165P, the second pad 175P and the contact opening CO may be aligned using the alignment mark, and an overlay state (e.g., an alignment state) with respect to the final pad structure may be measured.

The second semiconductor package 200A may include a wiring board 210, chip stacks in which a plurality of semiconductor chips 220 is stacked, and a molding portion 230. The wiring board 210 may include a lower pad 280 on a lower surface thereof and an upper pad 270 on an upper surface thereof. Each of the semiconductor chips 220 may include chip pads 225, and the chip pads 225 may be electrically connected to the upper pad 270 of the wiring board 210 by a wire 250.

The wire 250 may be a type of signal transmission medium electrically connecting the chip pads 225 and the upper pad 270 to each other. In addition, various types of signal transmission media such as bumps or solder balls may be applied. The wire 250, a wire for semiconductor wire bonding, may include or be formed of at least one of gold (Au), silver (Ag), platinum (Pt), aluminum (Al), copper (Cu), palladium (Pd), nickel (Ni), cobalt (Co), chromium (Cr), and titanium (Ti). The molding portion 230 may be formed of a polymer in a similar manner to or the same way as the molding portion 130 of the first semiconductor package 100A, for example, may be formed of an EMC.

The second semiconductor package 200A may be disposed on the first semiconductor package 100A. The second semiconductor package 200A may be electrically connected to a pad region defined by the contact opening CO of the first semiconductor package 100A using a conductive bump 290. The conductive bump 290 may be, for example, a solder ball. A POP-type semiconductor package 300A according to the present example embodiment may be electrically connected to an external device, for example, a system board or a main board by the external connection conductor 190 of the first semiconductor package 100A.

Figure 10:
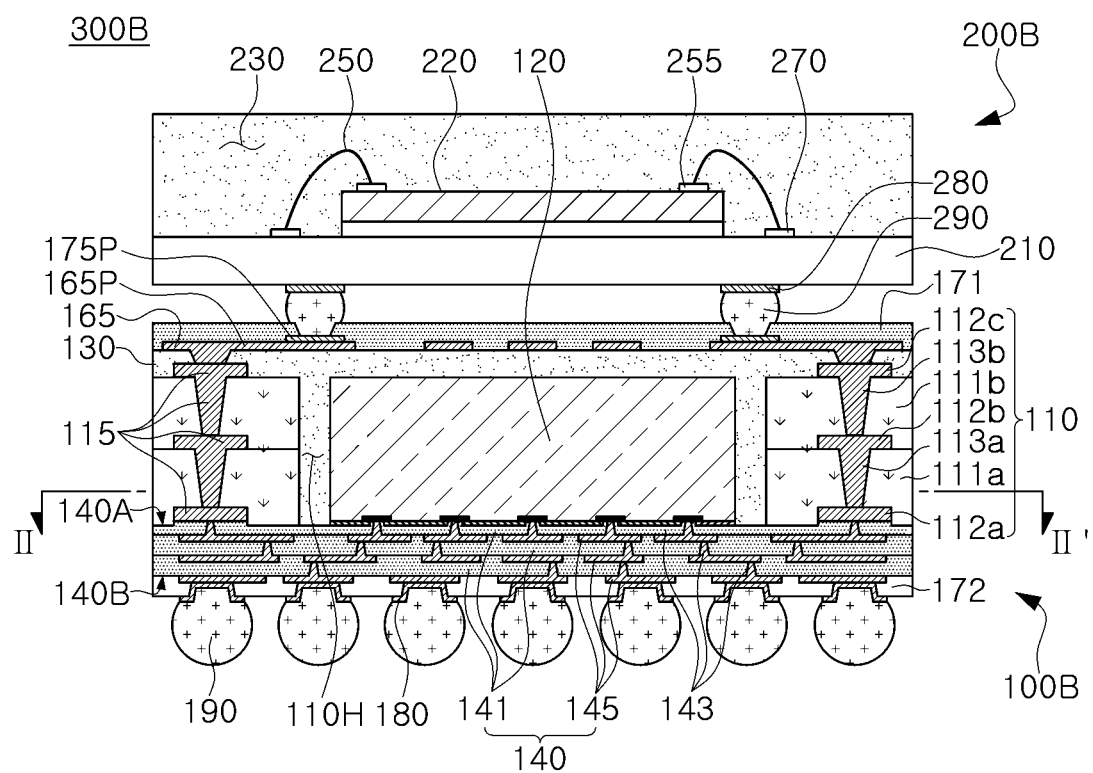
FIG. 10 is a side cross-sectional view illustrating a semiconductor package according to an example embodiment of the present disclosure.
Figure 11:
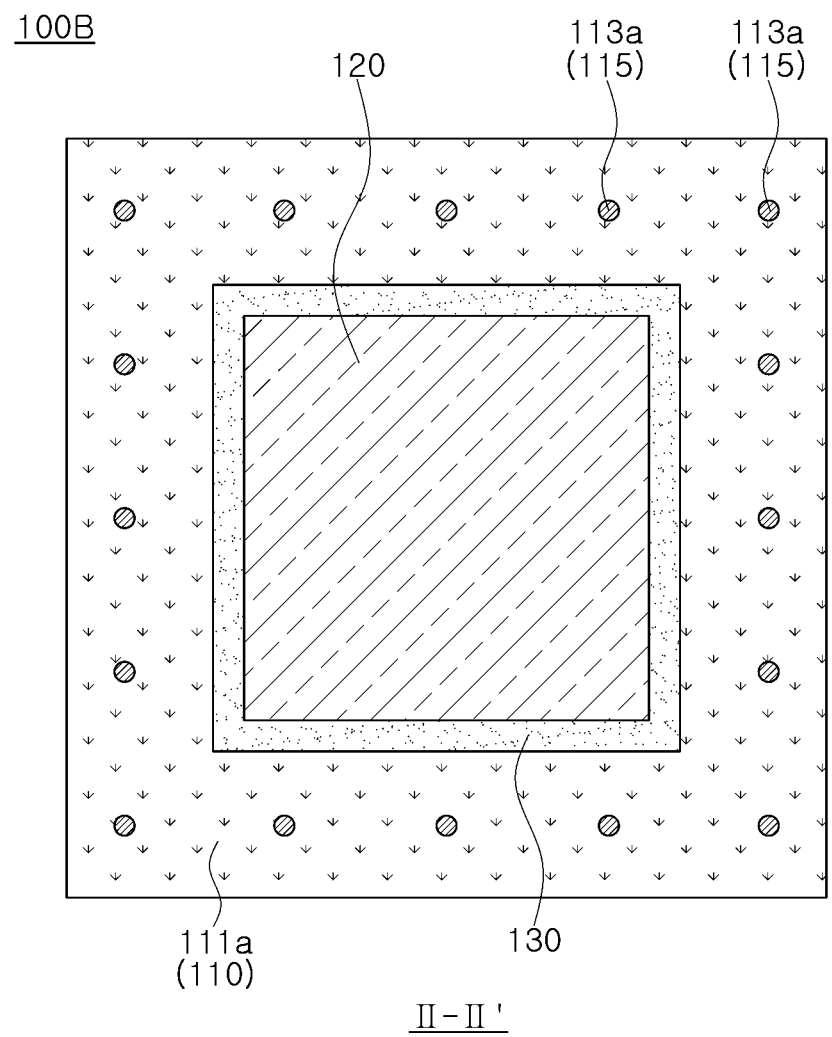
FIG. 11 is a plan view of the semiconductor package illustrated in FIG. 10 taken along line II-II'.

FIG. 10 is a side cross-sectional view illustrating a semiconductor package according to an example embodiment of the present disclosure. FIG. 11 is a plan view of the semiconductor package illustrated in FIG. 10 taken along line II-II'.

Referring to FIGS. 10 and 11, a semiconductor package 300B according to the present example embodiment may be a POP-type semiconductor package including a first semiconductor package 100B and a second semiconductor package 200B stacked thereon.

The first semiconductor package 100B employed in the present example embodiment may include a pad structure having an alignment mark in a similar manner to or the same way as the semiconductor package 100A described with reference to FIGS. 1 to 3B. For example, the first semiconductor package 100B may be understood as a semiconductor package similar to the semiconductor package 100A illustrated in FIGS. 1 to 3B. For example, the first semiconductor package 100B may be the same as the semiconductor package 100A illustrated in FIGS. 1 to 3B except that the first semiconductor package 100B includes a frame 110 having a wiring structure 115 using a conductive post as a vertical connection conductor, and the second redistribution layer 165 is formed directly on the molding portion 130. Accordingly, the description of the example embodiments illustrated in FIGS. 1 to 3B may be combined/incorporated with the description of the present example embodiment, except where otherwise specified.

The frame 110 may be disposed on the first surface 140A of the first redistribution structure 140, and may include a cavity 110H in which the semiconductor chip 120 is accommodated. The frame 110 may include the wiring structure 115 electrically connecting an upper surface thereof and a lower surface thereof. For example, the wiring structure 115 may electrically connect a wiring layer formed on the upper surface of the frame 110 and a wiring layer formed on the lower surface of the frame 110. The wiring structure 115 employed in the present example embodiment may include three wiring layers, e.g., first to third wiring layers 112a, 112b, and 112c, and first and second wiring vias 113a and 113b electrically connecting the first to third wiring layers 112a, 112b, and 112c to each other. However, the present disclosure is not limited thereto, and the wiring structure 115 may include a different number of layers and have a different structure in some example embodiments.

The frame 110 may be disposed together with the semiconductor chip 120 on the first surface 140A of the first redistribution structure 140, and the redistribution layer 145 (in particular, an uppermost first redistribution layer) may be electrically connected to each of the contact pads 125 of the semiconductor chip 120 and the wiring structure 115 by the redistribution via 143.

The frame 110 may further improve the rigidity of the first semiconductor package 100B depending on a specific material, and may perform a role of securing uniformity in the thickness of the molding portion 130. As described above, the frame 110 may have the wiring structure 115 electrically connecting wiring layers/patterns formed on the upper and lower surfaces thereof to each other, such that the semiconductor package 100A may be used as a POP-type package.

The semiconductor chip 120 disposed within the cavity 110H of the frame 110 may be disposed to be spaced apart from an inner sidewall of the frame 110 by a predetermined distance. The semiconductor chip 120 may be surrounded by the frame 110. However, the semiconductor chip 120 described above is only an example and may be modified to have other forms in various ways/manner, and may perform a different function depending on a form thereof. For example, the frame may include a plurality of cavities, and various semiconductor chips and/or various components (for example, capacitors) may be accommodated in respective cavities.

The frame 110 may be electrically connected to the redistribution structure 140, and may include the wiring structure 115 electrically connected to the semiconductor chip 120 by/through the redistribution structure 140. The frame 110 employed in the present example embodiment may include a first insulating layer 111a, a first wiring layer 112a in contact with the redistribution structure 140, the first wiring layer 112a buried in the first insulating layer 111a, a second wiring layer 112b disposed on a side opposite a side of the first insulating layer 111a on which the first wiring layer 112a is formed/buried, a second insulating layer 111b disposed on the first insulating layer 111a, the second insulating layer 111b covering the second wiring layer 112b, and a third wiring layer 112c disposed on the second insulating layer 111b. The first to third wiring layers 112a, 112b, and 112c may be electrically connected to each other through the first and second wiring vias 113a and 113b respectively passing through the first and second insulating layers 111a and 111b.

As in the present example embodiment, when the first wiring layer 112a is buried in the first insulating layer 111a, a step caused by the thickness of the first wiring layer 112a may be minimized, such that an insulation distance/thickness of the redistribution structure 140 may be implemented more uniformly. The first wiring layer 112a may be recessed in the first insulating layer 111a, such that a lower surface of the first insulating layer 111a may have a level/step difference from a lower surface of the first wiring layer 112a. In this case, it may be beneficial for preventing a material of the molding portion 130 from bleeding and contaminating the first wiring layer 112a in a process of forming the molding portion 130. The frame 110 may be manufactured to have a sufficient thickness by a substrate process or the like. Conversely, the redistribution structure 140 may be manufactured to have a small thickness by a semiconductor process or the like. Thus, a thickness of each of the first to third wiring layers 112a, 112b, and 112c of the frame 110 may be greater than a thickness of each of redistribution layers 142 of the redistribution structure 140.

For example, the first and second insulating layers 111a and 111b may be formed of a thermosetting resin such as an epoxy resin, a thermoplastic resin such as polyimide, a mixture of the resins and an inorganic filler, or a resin, together with the inorganic filler, impregnated into a core material such as a glass fiber, a fiber, glass cloth, or glass fabric, for example, prepreg, an ABF, FR-4, BT, or the like. For example, the first to third wiring layers 112a, 112b, and 112c may include or be formed of a conductive material such as copper (Cu), aluminum (Al), silver (Ag), tin (Sn), gold (Au), nickel (Ni), lead (Pb), titanium (Ti), or an alloy thereof. The first to third wiring layers 112a, 112b, and 112c may perform various functions depending on a design of a corresponding layer. For example, a ground pattern may be included in addition to a power pattern and a signal pattern. When formed by/using the same plating process, the first and second wiring vias 113a and 113b may be integrated with the second and third wiring layers 112b and 112c, respectively.

The second redistribution layer 165 employed in the present example embodiment may be directly formed on the molding portion 130. The second redistribution layer 165 may be directly formed on an upper surface of the molding portion 130 without formation of an additional insulating layer on the molding portion/layer 130. The first pad 165P extending from the second redistribution layer 165 may include the alignment hole described with reference to FIGS. 3A and 3B. In the present example embodiment, the alignment hole may be formed to expose a surface of the molding portion 130. The second pad 175P may be formed on the first pad 165P, and a pad region may be exposed through the contact opening CO of the protective insulating layer 171.

The second semiconductor package 200B may be disposed on the first semiconductor package 100B, and may be electrically connected to a pad region defined by the contact opening CO of the first semiconductor package 100B through/using the conductive bump 290.

The second semiconductor package 200B may include the wiring board 210, the semiconductor chips 220, and the molding portion 230. The wiring board 210 may include the lower pad 280 on a lower surface thereof and the upper pad 270 on an upper surface thereof. Each of the semiconductor chips 220 may include the chip pads 225, and the chip pads 225 may be electrically connected to the upper pad 270 of the wiring board 210 by the wire 250.

Figure 12A:
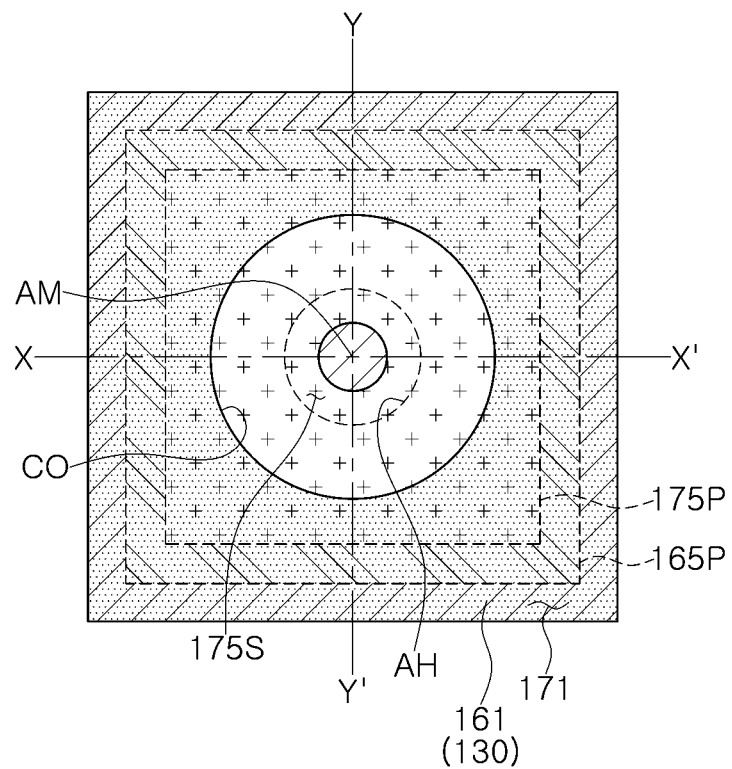
FIGS. 12A and 12B are respectively a plan view and a side cross-sectional view illustrating a pad structure employable in a semiconductor package according to an example embodiment of the present disclosure.
Figure 12B:
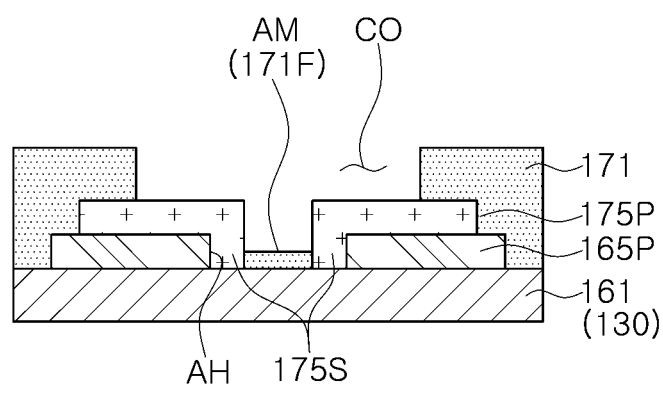

FIGS. 12A and 12B are respectively a plan view and a side cross-sectional view illustrating a pad structure employable in a semiconductor package according to an example embodiment of the present disclosure.

Referring to FIGS. 12A and 12B, a pad structure according to the present example embodiment may be similar to or the same as the pad structure illustrated in FIGS. 3A and 3B, except that the second pad 175P and the contact opening CO are arranged in a substantially ideal alignment, the alignment hole AH (or alignment mark AM) and the second pad 175P have different shapes, and an upper surface level of the alignment mark AM is different from the one of the pad structure illustrated in FIGS. 3A and 3B. Accordingly, the method of forming the pad structure described with reference to FIGS. 3A and 3B and the method of forming the pad structure described with reference to FIGS. 4 to 8B may be combined/incorporated with the description of the present example embodiment, except where otherwise specified.

In the present example embodiment, it is exemplified/shown that central portions (e.g., center points) of the second pad 175P and the contact opening CO are positioned on a central portion (e.g., center point) of the first pad 165P, e.g., in a plan view, as an ideal alignment. In addition, the alignment hole AH (or the alignment mark AM) may have a circular shape, unlike the previous example embodiment. Unlike the previous example embodiment, the second pad 175P may also have a rectangular shape similar to that of the first pad 165P. Thus, the alignment mark AM and the second pad 175P may have various different shapes.

The alignment mark AM may have the filled material portion 171F in a similar manner to the previous example embodiment. However, a relatively large amount of the filled material portion 171F may be removed in a process of forming the contact opening CO. As illustrated in FIG. 12B, an upper surface the alignment mark AM may be relatively low.

Figure 13A:
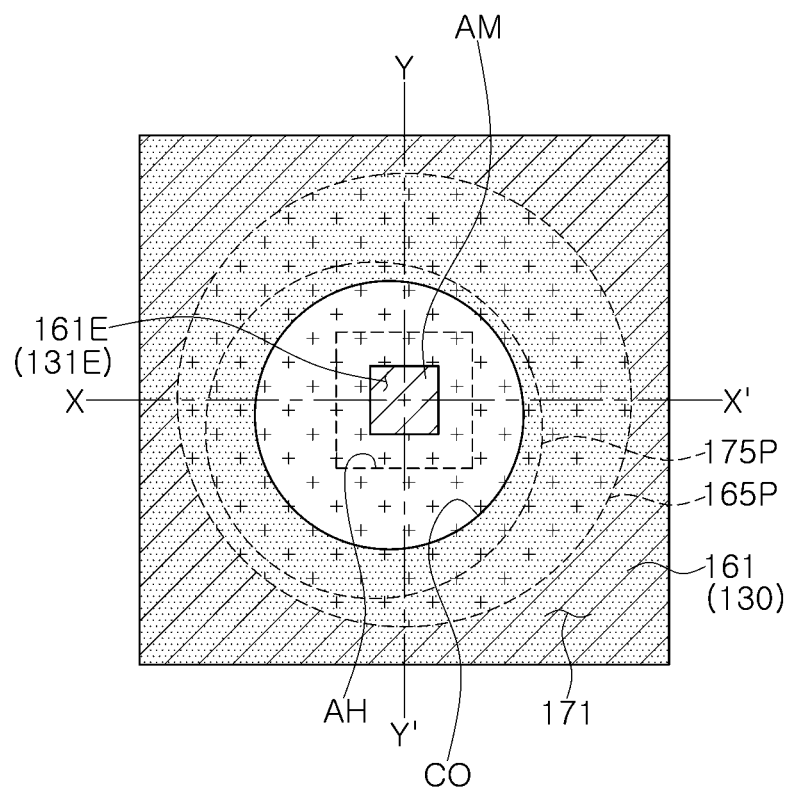
FIGS. 13A and 13B are respectively a plan view and a side cross-sectional view illustrating a pad structure employable in a semiconductor package according to an example embodiment of the present disclosure.
Figure 13B:
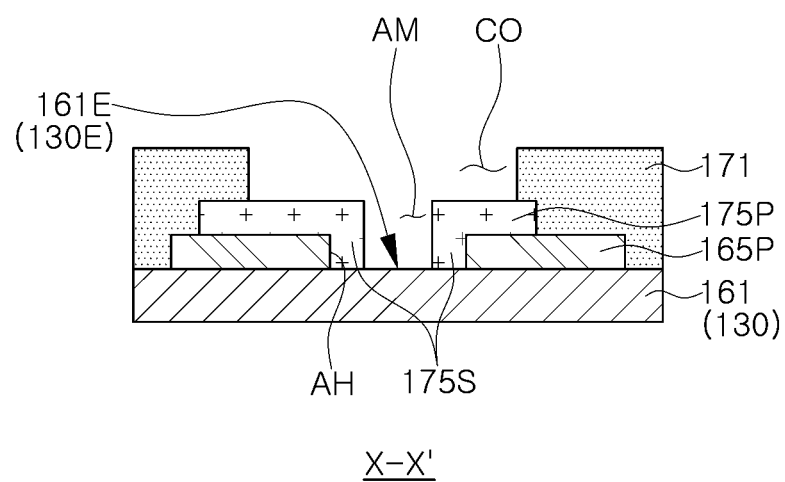

FIGS. 13A and 13B are respectively a plan view and a side cross-sectional view illustrating a pad structure employable in a semiconductor package according to an example embodiment of the present disclosure.

A pad structure according to the present example embodiment may be similar to the pad structure illustrated in FIGS. 3A and 3B. For example, the pad structure according to the present example embodiment may be the same as the pad structure illustrated in FIGS. 3A and 3B except that the second pad 175P and the contact opening CO have different types of misalignments from the ones illustrated in FIGS. 3A and 3B, a shape of the first pad 165P is different from the one illustrated in FIGS. 3A and 3B, and all protective insulating layer materials are removed from the alignment hole AH. Accordingly, a method of forming the pad structure described with reference to FIGS. 3A and 3B and a method of forming the pad structure described with reference to FIGS. 4 to 8B may be combined/incorporated with the description of the present example embodiment, except where otherwise specified.

In the present example embodiment, the second pad 175P and the contact opening CO may have an alignment deviation in a direction, different from those of the previous example embodiments. An overlay (e.g., an overlay alignment) of the pad structure according to the present example embodiment may be measured by the method described with reference to FIGS. 4 and 5A to 9B using the alignment mark exposed by the contact opening. The first pad 165P may have a circular shape similar to that of the second pad.

In the present example embodiment, the filled material portion of the protective insulating layer 171 in the alignment hole AH may be completely removed in a process of forming the contact opening CO. In this case, the alignment mark AM may be provided as a remaining region of the alignment hole AH defined by the side portion 175S of the second pad 175P. For example, the alignment mark AM according to the present example embodiment may be visually identified by portions of a second insulating layer (161 of FIG. 1) and a molding portion (130 of FIG. 10) and/or by boundaries (e.g., inner sidewalls) of the second pad 175P.

Figure 14A:
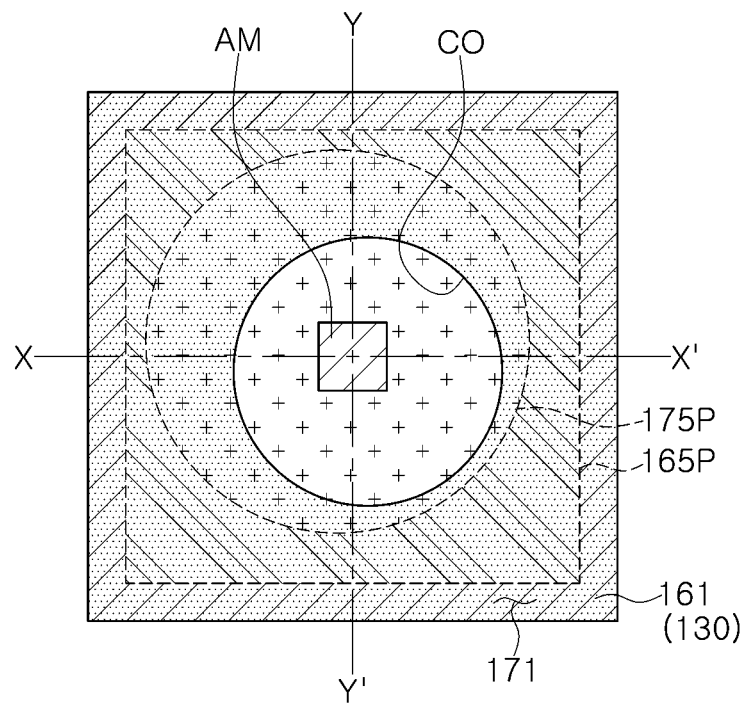
FIGS. 14A and 14B are respectively a plan view and a cross-sectional side view of a pad structure employable in a semiconductor package according to an example embodiment of the present disclosure.
Figure 14B:
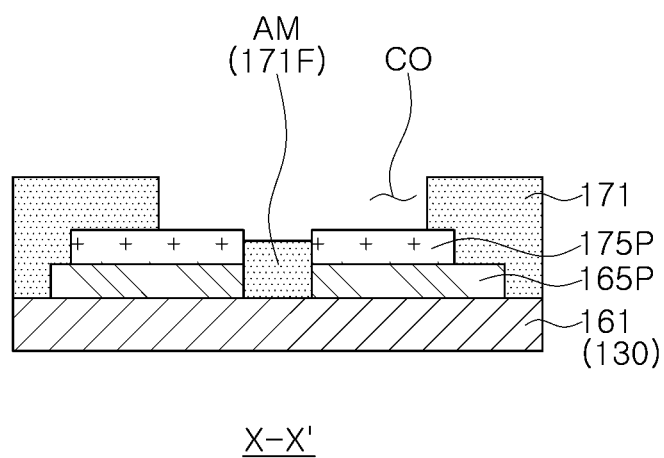

FIGS. 14A and 14B are respectively a plan view and a cross-sectional side view of a pad structure employable in a semiconductor package according to an example embodiment of the present disclosure.

A pad structure according to the present example embodiment may be similar to the pad structure illustrated in FIGS. 3A and 3B. For example, the pad structure according to the present example embodiment may be the same as the pad structure illustrated in FIGS. 3A and 3B except that the second pad 175P and the contact opening CO have different types of alignment deviations, the second pad 175P does not have a side portion extending to a sidewall of the alignment hole AH, and the alignment hole AH is filled with the filled material portion 171F of the protective insulating layer 171. Accordingly, a method of forming the pad structure described with reference to FIGS. 3A and 3B and a method of forming the pad structure described with reference to FIGS. 4 to 8B may be combined/incorporated with the description of the present example embodiment, except where otherwise specified.

As illustrated in FIG. 14A, the second pad 175P and the contact opening CO may have a shape having an alignment deviation in a direction, different from those of the previous example embodiments. Unlike the previous example embodiments, the second pad 175P employed in the present example embodiment may not have a side portion extending to a sidewall of the alignment hole AH. The alignment hole AH may be filled with another material, such that an inner sidewall of a first pad may not be exposed. The filled material portion may be, for example, a portion of the protective insulating layer, but the present disclosure is not limited thereto. The filled material portion may be another visually identifiable insulating or conductive material, and may be filled through a filling process. For example, a portion of the protective insulating layer 171 may remain in the alignment hole AH and contact side surfaces of the first pad 165P and the second pad 175P.

Thus, an alignment mark according to the present example embodiment and an alignment according thereto may be implemented in various forms. In addition, according to the present example embodiment, an alignment state of a second pad and a contact opening may be measured using an alignment hole (or alignment mark) prepared in advance of a first pad, and a defect in a final pad (for example, exposure of the first pad) may be quickly and accurately determined using the measured value in a non-destructive manner.

Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally unless the context indicates otherwise.

While example embodiments have been shown and described above, it will be apparent to those skilled in the art that modifications and variations could be made without departing from the scope of the present disclosure as defined by the appended claims.

What is claimed is:

1. A semiconductor package comprising:
    a redistribution structure having a first surface and a second surface opposite to each other, and including a first redistribution layer;
    a semiconductor chip disposed on the first surface of the redistribution structure and having a contact pad electrically connected to the first redistribution layer;
    a vertical connection conductor disposed around the semiconductor chip on the first surface of the redistribution structure and electrically connected to the first redistribution layer;
    a molding portion disposed on the first surface of the redistribution structure and encapsulating the semiconductor chip and the vertical connection conductor;
    a second redistribution layer disposed on the molding portion, electrically connected to the vertical connection conductor, and having a plurality of first pads, each of the plurality of first pads having an alignment hole;
    a plurality of second pads respectively disposed on the plurality of first pads, each of the plurality of second pads having a side portion covering an inner sidewall of the alignment hole, the alignment hole having an inner space surrounded by the side portion, and the inner space being provided as an alignment mark; and
    a protective insulating layer disposed on the molding portion, covering the second redistribution layer, and having a plurality of contact openings respectively exposing regions of the plurality of second pads.

2. The semiconductor package of claim 1, wherein the protective insulating layer includes an opaque insulating layer.

3. The semiconductor package of claim 1, wherein the alignment mark is positioned in the inner space of the alignment hole, and includes a portion formed of a material the same as that of the protective insulating layer.

4. The semiconductor package of claim 3, wherein an upper surface of the alignment mark is equal to or lower than that of an upper surface of a corresponding one of the second pads.

5. The semiconductor package of claim 1, wherein the plurality of contact openings are disposed to expose at least a portion of the alignment mark.

6. The semiconductor package of claim 1, wherein
    the molding portion is exposed on a bottom surface of the inner space of the alignment hole, and
    the alignment mark is provided by an exposed region of the molding portion.

7. The semiconductor package of claim 1, wherein the alignment hole is positioned in a central portion of each of the plurality of first pads.

8. The semiconductor package of claim 7, wherein a center point of at least one of the plurality of second pads is positioned to deviate from a center point of the alignment hole in a plan view.

9. The semiconductor package of claim 7, wherein a center point of at least one of the plurality of contact openings is positioned to deviate from a center point of the alignment hole.

10. The semiconductor package of claim 1, wherein the plurality of second pads is formed to be positioned within upper surfaces of the plurality of first pads, respectively.

11. The semiconductor package of claim 1, wherein the alignment hole has a width equal to or less than 50% of a width of each of the plurality of second pads.

12. The semiconductor package of claim 1, wherein the alignment hole has a width greater than twice a thickness of each of the plurality of second pads.

13. The semiconductor package of claim 1, wherein the alignment mark has a width in a range from 10 µm to 50 µm.

14. The semiconductor package of claim 1, wherein the plurality of first pads includes copper, and the plurality of second pads includes Ni/Au.

15. A semiconductor package comprising:
a redistribution structure having a first surface and a second surface opposite to each other, and including a first redistribution layer;
a semiconductor chip disposed on the first surface of the redistribution structure and having a contact pad electrically connected to the first redistribution layer;
a frame disposed on the first surface of the redistribution structure, having a cavity accommodating the semiconductor chip, and including a wiring structure electrically connected to the first redistribution layer;
a molding portion disposed on the first surface of the redistribution structure and encapsulating the semiconductor chip;
a second redistribution layer disposed on the molding portion, electrically connected to the wiring structure, and having a plurality of first pads, each of the plurality of first pads having an alignment hole;
a plurality of second pads respectively disposed on the plurality of first pads, each of the plurality of second pads having a side portion covering an inner sidewall of the alignment hole, wherein the alignment hole has an inner space surrounded by the side portion, and the inner space is provided as an alignment mark; and
an opaque protective insulating layer disposed on the molding portion, covering the second redistribution layer, having a plurality of contact openings respectively exposing regions of the plurality of second pads, the plurality of contact openings exposing at least a portion of the alignment mark.

16. The semiconductor package of claim 15, wherein the alignment mark is positioned in the inner space of the alignment hole, and includes a portion formed of a material the same as that of the opaque protective insulating layer, and
a level of an upper surface of the alignment mark is equal to or lower than that of an upper surface of a corresponding one of the second pads.

17. The semiconductor package of claim 15, wherein the plurality of second pads has widths narrower than widths of the plurality of first pads, respectively, and the alignment hole has a width greater than twice a thickness of each of the plurality of second pads and less than or equal to 50% of a width of each of the plurality of second pads.

18. The semiconductor package of claim 15, further comprising:
an additional semiconductor package disposed on the semiconductor package, the additional semiconductor package having a wiring board and an additional semiconductor chip disposed on the wiring board,
wherein the additional semiconductor package is electrically connected to a region of each of the plurality of second pads by a plurality of conductive bumps.

19. The semiconductor package of claim 15, wherein
the frame includes a first insulating layer and a second insulating layer sequentially disposed on the first surface of the redistribution structure, and
the wiring structure includes a first wiring layer buried in a lower surface of the first insulating layer and electrically connected to a first redistribution via formed in the redistribution structure, a second wiring layer disposed on an upper surface of the first insulating layer, a third wiring layer disposed on an upper surface of the second insulating layer, a first wiring via passing through the first insulating layer and electrically connecting the first and second wiring layers to each other, and a second wiring via passing through the second insulating layer and electrically connecting the second and third wiring layers to each other.

20. A semiconductor package comprising:
a first semiconductor package; and
a second semiconductor package disposed on the first semiconductor package;
wherein the first semiconductor package includes:
a redistribution structure having a first surface and a second surface opposite to each other, and including a first redistribution layer;
a first semiconductor chip disposed on the first surface of the redistribution structure and having a contact pad electrically connected to the first redistribution layer;
a vertical connection conductor disposed around the first semiconductor chip on the first surface of the redistribution structure and electrically connected to the first redistribution layer;
a molding portion disposed on the first surface of the redistribution structure and sealing the first semiconductor chip and the vertical connection conductor;
a second redistribution layer disposed on the molding portion, electrically connected to the vertical connection conductor, and having a plurality of first pads, each of the plurality of first pads having an alignment hole;
a plurality of second pads respectively disposed on the plurality of first pads, each of the plurality of second pads having a side portion covering an inner sidewall of the alignment hole, wherein the alignment hole has an inner space surrounded by the side portion, and the inner space is provided as an alignment mark; and
a protective insulating layer disposed on the molding portion, covering the second redistribution layer, and having a plurality of contact openings for respectively exposing regions of the plurality of second pads, and
the second semiconductor package includes:
a wiring board, a second semiconductor chip disposed on the wiring board, and a plurality of connection pads disposed on a lower surface of the wiring board and respectively electrically connected to regions of the plurality of second pads.

\* \* \* \* \*